United States Patent [19]

Manabe

[11] Patent Number: 5,306,665
[45] Date of Patent: Apr. 26, 1994

[54] MANUFACTURING A WIRING FOR A SEMICONDUCTOR DEVICE BY A FORWARDLY TAPERED STACK OF TWO CONDUCTOR FILMS

[75] Inventor: Kazutaka Manabe, Tokyo, Japan

[73] Assignee: NEC Corporation, Tokyo, Japan

[21] Appl. No.: 132,345

[22] Filed: Oct. 6, 1993

[30] Foreign Application Priority Data

Oct. 6, 1992 [JP] Japan ................................. 4-266955

[51] Int. Cl.⁵ .......................................... H01L 21/283
[52] U.S. Cl. ..................... 437/189; 437/192; 437/194; 437/195; 437/944; 148/DIG. 104
[58] Field of Search ............. 437/200, 189, 192, 194, 437/195, 944, 984; 148/DIG. 104, DIG. 106

[56] References Cited

U.S. PATENT DOCUMENTS

| 4,824,796 | 4/1989 | Chiu et al. | 437/57 |
| 4,871,419 | 10/1989 | Nakano | 156/643 |
| 5,177,026 | 1/1993 | Ishikawa | 437/39 |
| 5,187,121 | 2/1993 | Cote et al. | 437/195 |

FOREIGN PATENT DOCUMENTS

| 63-126275 | 5/1988 | Japan | 437/984 |
| 3-46237 | 2/1991 | Japan | 437/984 |

OTHER PUBLICATIONS

J. L. Yeh et al., "Applications of Selective Tungsten on Aluminum in Multilevel Metal Technologies", V-MIC Conference held by the IEEE on Jun. 15-16, 1987, pp. 132-137.

Primary Examiner—T. N. Quach
Attorney, Agent, or Firm—Sughrue, Mion, Zinn, Macpeak & Seas

[57] ABSTRACT

As a stack of a patterned film and an overlying conductor film, a conductor pattern is manufactured on an isolation layer of a semiconductor device by forming a two-film layer of a first conductor film and a semiconductor film, patterning the two-film layer in compliance with the conductor pattern into a patterned layer consisting of the patterned film and a semiconductor pattern and having a layer side surface, forming an insulator side wall on the side surface, etching away the semiconductor pattern, and selectively forming a second conductor film as the overlying conductor film. The side wall is used in preventing, when the second conductor film is selectively grown, undesirable lateral growth. Typically, the first and the second conductor films are made of aluminium to thicknesses of 200 and 400 nm and the semiconductor film, of polysilicon to a thickness of 400 nm.

5 Claims, 2 Drawing Sheets

MANUFACTURING A WIRING FOR A SEMICONDUCTOR DEVICE BY A FORWARDLY TAPERED STACK OF TWO CONDUCTOR FILMS

BACKGROUND OF THE INVENTION

This invention relates to a method of manufacturing a conductor pattern for use as a wiring in a semiconductor device.

In accordance with this invention, the method is applicable to whichever of semiconductor devices known at present. The conductor pattern is manufactured on an insulator surface of an insulator layer formed on a semiconductor substrate of the semiconductor device. The insulator layer is for electrically insulating the conductor pattern selectively from other parts of the semiconductor device.

In the manner which will later be described in greater detail, a conventional method of manufacturing a conductor pattern on an insulator surface formed on a semiconductor substrate comprises the steps of: (A) forming a first conductor film on the insulator surface with either aluminium or tungsten to a thin film thickness; (B) patterning the first conductor film in compliance with the conductor pattern into a patterned film having a patterned surface; and (C) selectively growing a second conductor film with aluminium on the patterned surface to provide the conductor pattern of a desired thickness. When manufactured in accordance with the conventional method as a conventional pattern, the conductor pattern has various drawbacks as follows.

Selective growth of the second conductor film is for increasing the thin film thickness to the desired thickness. During the selective growth, the second film inevitably laterally grows. This gives a reversedly or inversedly tapered side surface to the conventional pattern.

As a consequence, the conventional pattern is unavoidably provided with a part which has a wide pattern width and is liable to undesiredly short circuited either with a different part of the conventional pattern, namely, in the conductor pattern, or with a like pattern manufactured on the insulator surface. Such a conductor pattern is often covered with a covering film of an insulating material. The reversedly tapered side surface adversely affects coverage of the conventional pattern with the covering film.

The selective growth must therefore be restricted. This restriction gives a thin total thickness to the conventional pattern. In other words, it has been very difficult to actually give the desired thickness to the conventional pattern. This difficulty has often resulted in an objectionable break in the conventional pattern particularly when a fine pattern of a narrow pattern width must be given to the conventional pattern.

Manufacture of a like two-film conductor pattern is described in a paper which was published under the title of "Applications of Selective Tungsten on Aluminium in Multilevel Metal Technologies" and was read by J. L. Yeh and five others in V-MIC Conference held by the IEEE on Jun. 15-16, 1987. Creation of a dielectric side wall is mentioned in the Yeh et al paper.

SUMMARY OF THE INVENTION

In view of the foregoing, it is an object of the present invention to provide a novel method of manufacturing a reliable conductor pattern on an insulator surface of an insulator layer formed on a semiconductor substrate.

It is another object of this invention to provide a method which is of the type described and by which the conductor pattern is manufactured as a stack of two conductor film portions without the stack given a reversedly tapered side surface.

It is still another object of this invention to provide a method which is of the type described and by which it is reliably possible to prevent a short circuit from objectionably taking place in the conductor pattern and/or between the conductor pattern and a similar pattern manufactured according to the novel method on the insulator surface.

It is yet another object of this invention to provide a method which is of the type described and by which it is possible to insure a reliable coverage of the conductor pattern with a covering insulator film subsequently formed on the conductor pattern.

It is a further object of this invention to provide a method which is of the type described and by which a desired thickness is readily and reliably given to the conductor pattern.

It is a still further object of this invention to provide a method which is of the type described and by which it is reliably possible to prevent a break from undesiredly occurring in the conductor pattern even when the conductor pattern is a very fine pattern of a very narrow pattern width.

It is a yet further object of this invention to provide a method which is of the type described and in which a side wall is positively used to suppress an inevitable lateral growth of an overlying conductor film when the conductor film is formed by selective growth on an underlying conductor film on manufacturing the conductor pattern.

Other objects of this invention will become clear as the description proceeds.

In accordance with this invention, there is provided a method which is used in manufacturing a conductor pattern on an insulator surface of an insulator layer formed on a semiconductor substrate and which comprises the steps of: (A) forming a two-film layer with a first conductor film formed on the insulator surface and a semiconductor film formed on the first conductor film; (B) patterning the two-film layer into a patterned layer having a side surface with the first conductor film patterned in compliance with the conductor pattern into a patterned film partially exposing the insulator surface around the patterned film as an exposed area and with a part of the semiconductor film left on the patterned film as a patterned semiconductor pattern having a patterned surface; (C) forming an insulator film on the patterned surface, the side surface, and the exposed area; (D) etching back the insulator film to leave a side wall on the side surface and to expose the patterned surface; (E) etching away the semiconductor pattern to expose the patterned film as an exposed film; and (F) selectively forming a second conductor film on the exposed film to provide the conductor pattern.

BRIEF DESCRIPTION OF THE DRAWING

FIGS. 2 (A) through 2 (D) show vertical sections of a semiconductor device during various steps of a

DESCRIPTION OF THE PREFERRED EMBODIMENT

Figure 1:
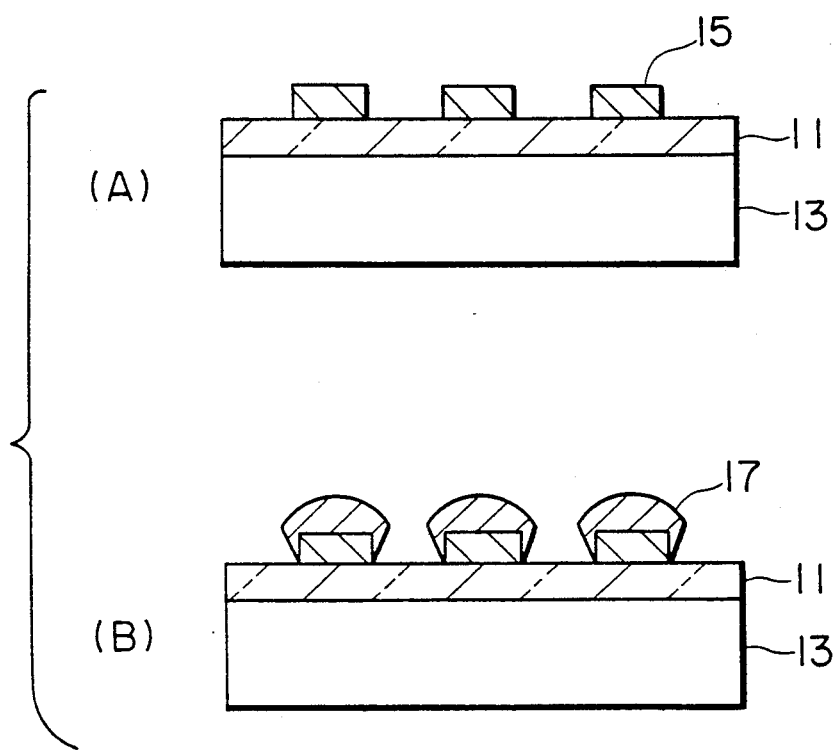
FIGS. 1 (A) and 1 (B) show vertical sections of a semiconductor device during various steps of a conventional method.

Referring to FIGS. 1 (A) and (B), a conventional method of manufacturing a conductor pattern will first be described in order to facilitate an understanding of the present invention. In general, the conductor pattern is manufactured for use as a wiring or runner on an insulator surface of an insulator or isolation layer 11 formed on a semiconductor substrate 13 of a semiconductor device. In accordance with the conventional method, a first conductor film is first formed on the insulator surface with either aluminium or tungsten.

In the manner illustrated in FIG. 1 (A), the first conductor film is patterned in compliance with the conductor pattern into a patterned film 15 having a patterned surface. It is possible to understand that three portions of the patterned film 15 are exemplified. Alternatively, it is possible to understand that three conductor patterns are manufactured in compliance with a predetermined pattern of the wiring to provide three patterned films exemplified at 15. In either event, each patterned film is formed by covering the first conductor film with a photoresist mask, focussing a beam of rays on the photoresist mask to partially expose the first conductor film either singly or collectively as an exposed portion, and etching away the exposed portion to leave the patterned film or films.

It should be noted in connection with the foregoing that the first conductor film has a small selection ratio relative to the photoresist mask and that the photoresist mask must have an accordingly thick mask thickness. This results in an insufficient focussing margin particularly when the predetermined pattern is a fine pattern of a narrow pattern width.

In the manner depicted in FIG. 1 (B), a second conductor film 17 of aluminium is selectively grown on the patterned surface. In cooperation with the patterned film 15, the second conductor film 17 provides the conductor pattern of a desired pattern thickness. It should be noted in this connection that the second conductor film inevitably laterally grows in the manner somewhat exaggeratedly exemplified. As a consequence, the conductor pattern is unavoidably given a reversedly or inversely tapered side surface when manufactured as a conventional pattern in accordance with the conventional method.

This selective growth of the second conductor film has made it possible to give a thin film thickness to the first conductor film. As a result, it has become possible to reduce the mask thickness and achieve an appreciably sufficient focussing margin. The reversedly tapered side surface has, however, given rise to various shortcomings mentioned hereinbefore.

Figure 2:
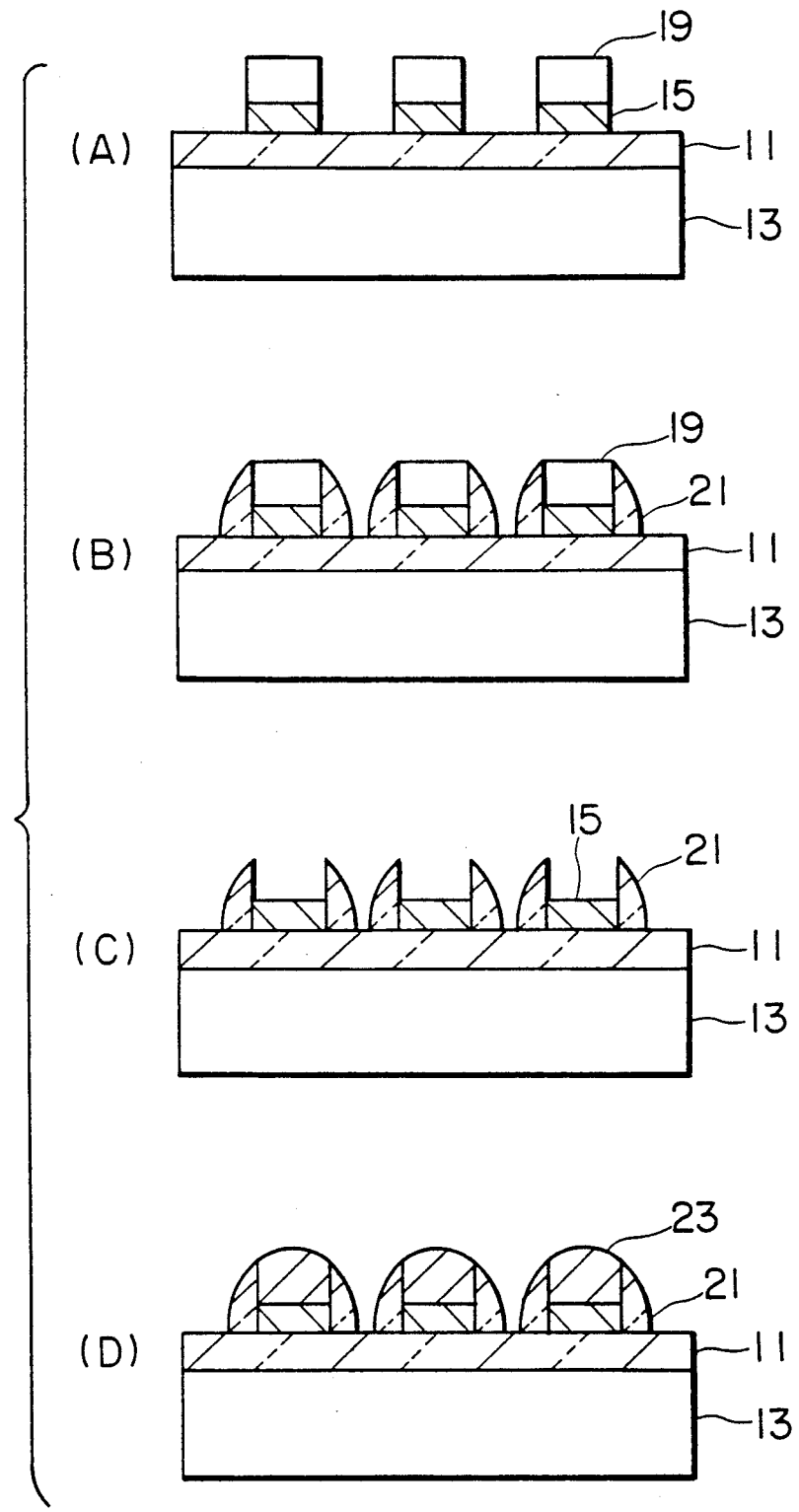

Referring now to FIGS. 2 (A) through (D), the description will proceed to a novel method according to a preferred embodiment of this invention. Similar parts are designated by like reference numerals.

In the manner known in the art, an insulator or isolation layer 11 is formed, as of silicon dioxide, on a semiconductor substrate 13 of a semiconductor chip which is typically a silicon semiconductor chip and from which a semiconductor device can be manufactured. The insulator layer 11 has an insulator surface and is for isolating, selectively from other parts of the semiconductor device, a conductor pattern manufactured on the insulator surface in accordance with the novel method.

As will presently become clear, a first conductor film was formed on the insulator surface, typically of aluminium, to a preferred first film thickness of 200 nm. Subsequently, a semiconductor film was formed on the first conductor film to provide a two-film layer on the insulator surface. It is preferred to form the semiconductor film by sputter evaporating polysilicon to a semiconductor film thickness of 400 nm.

In the manner illustrated in FIG. 2 (A), the two-film layer was patterned in the known manner into a patterned layer in compliance with the conductor pattern. For example, the known photolithography technique is applied by using a photoresist mask (not shown).

More particularly, the first conductor film is patterned into a patterned film 15 which is of the type discussed with reference to FIG. 1 (A) and partially exposes the insulator surface therearound as an exposed area. The semiconductor film is partially left on the patterned film 15 as a semiconductor pattern 19 having a patterned surface. In this manner, the patterned layer is composed of the patterned film 15 and the semiconductor pattern 19 and is given the patterned surface and a layer side surface which is depicted laterally of the patterned layer. As will shortly become clear, an insulator film was thereafter formed on the patterned surface, the side surface, and the exposed area. The insulator film is formed typically of silicon dioxide to an insulator film thickness of 200 nm.

It should be noted in connection with the foregoing that the above-mentioned polysilicon film has a large selection ratio relative to the photoresist mask during patterning. The large selection ratio is about ten times as large as the afore-described small selection ratio between the first conductor film and the photoresist mask. As a consequence, it is possible to use on patterning the polysilicon film of the semiconductor film thickness of 400 nm a photoresist mask which is as thin as the photoresist mask used on patterning the first conductor film of the first film thickness of 200 nm. It is furthermore possible to attain a focussing margin which is not inferior to that used in the conventional method illustrated with reference to FIGS. 1 (A) and (B). It should moreover be noted that the layer side surface is, if tapered, never reversedly tapered but forwardly tapered.

As depicted in FIG. 2 (B), the insulator film was etched back to leave a side wall 21 on the layer side surface and to expose the patterned surface. Around the side wall 21, the exposed area is a little narrower than that partially exposed when the first conductor film is patterned.

In the manner depicted in FIG. 2 (C), the semiconductor pattern 19 (FIGS. 2 (A) and (B)) was etched away to expose the patterned film 15 as an exposed film which is not different from the patterned film and will be indicated by the reference numeral 15. It is preferred to resort to the dry etch technique on etching away the semiconductor pattern. Inasmuch as a selection ratio is sufficiently large between the polysilicon film and the insulator film, the side wall 21 remains substantially unaffected.

As illustrated in FIG. 2 (D), a second conductor film 23 was selectively formed on the exposed film 15. The second conductor film is not different in principle from the second conductor film 17 described in conjunction with FIG. 1 (B) but is identified by a different reference numeral 23. The second conductor film 23 was made of aluminium and was given a second film thickness of 400 nm.

In accordance with the method being illustrated, the second conductor film 23 was selectively grown. As a result, the second conductor film 23 is given a hillock shape exaggeratedly exemplified in FIG. 2 (D). Although named similar to the first conductor film, the second conductor film 23 is grown selectively only on the exposed film 15. It should clearly be appreciated that the side wall 21 is positively used to prevent the second conductor film 23 from laterally growing. Consequently, a stack of the patterned film 15 and the second conductor film 23 was reliably manufactured as the conductor pattern to the desired thickness and is possessed of a stack side surface which is, if tapered, forwardly tapered rather than reversedly. This makes it possible to favorably attain the objects described hereinabove. It is possible to refer to the stack simply as a stack of the first and the second conductor films.

While this invention has thus far been described in specific conjunction with a single preferred embodiment thereof, it will now be readily possible for one skilled in the art to put this invention into practice in various other manners. For example, it is possible to form the first conductor film either by a known aluminium alloy or by a known three-layer film of titanium, titanium silicide, and a metal which essentially consist of aluminium. It is possible in either event to form the second conductor film 23 by the aluminium alloy also in a case where the first conductor film is made of aluminium as described in connection with FIGS. 2 (A) through (D). It is possible to form the semiconductor film by a single crystal of silicon or by amorphous silicon. It is possible to etch away the insulator film on forming the side wall 21 either to expose the exposed area or with the exposed area covered with the insulator film.

What is claimed is:

1. A method of manufacturing a conductor pattern on an insulator surface of an insulator layer formed on a semiconductor substrate, said method comprising the steps of:
   forming a two-film layer with a first conductor film formed on said insulator surface and a semiconductor film formed on said first conductor film;
   patterning said two-film layer into a patterned layer having a side surface with said first conductor film patterned in compliance with said conductor pattern into a patterned film partially exposing said insulator surface around said patterned film as an exposed area and with a part of said semiconductor film left on said patterned film as a semiconductor pattern having a patterned surface;
   forming an insulator film on said patterned surface, said side surface, and said exposed area;
   etching back said insulator film to leave a side wall on said side surface and to expose said patterned surface;
   etching away said semiconductor pattern to expose said patterned film as an exposed film; and
   selectively forming a second conductor film on said exposed film to provide said conductor pattern.

2. A method as claimed in claim 1, wherein said selectively forming step is carried out by selective growth of said second conductor film on said exposed film by using said side wall in preventing said second conductor film from laterally growing.

3. A method as claimed in claim 2, wherein said second conductor film is selectively formed with at least one material member selected from aluminium and an aluminium alloy.

4. A method as claimed in claim 3, wherein said first conductor film is formed with said at least one material member.

5. A method as claimed in claim 3, wherein said first film is formed as a three-layer film of titanium, titanium silicide, and a metal consisting essentially of aluminium.

* * * * *